(12) United States Patent
Milne et al.

(10) Patent No.: US 9,843,155 B2
(45) Date of Patent: Dec. 12, 2017

(54) METHOD AND APPARATUS FOR FORMING FINE SCALE STRUCTURES IN DIELECTRIC SUBSTRATE

(71) Applicant: M-SOLV LIMITED, Oxford, Oxfordshire (GB)

(72) Inventors: David Charles Milne, Chipping Norton (GB); Philip Thomas Rumsby, Woodstock (GB); David Thomas Edmund Myles, Oxford (GB)

(73) Assignee: M-SOLV LIMITED, Oxford (GB)

( * ) Notice: Subject to any disclaimer, the term of this patent is extended or adjusted under 35 U.S.C. 154(b) by 106 days.

(21) Appl. No.: 14/373,798

(22) PCT Filed: Apr. 19, 2013

(86) PCT No.: PCT/GB2013/050995
§ 371 (c)(1),
(2) Date: Jul. 22, 2014

(87) PCT Pub. No.: WO2014/068274
PCT Pub. Date: May 8, 2014

(65) Prior Publication Data
US 2015/0230341 A1     Aug. 13, 2015

(30) Foreign Application Priority Data

Nov. 2, 2012   (GB) .................................. 1219756.2

(51) Int. Cl.
*H05K 3/00* (2006.01)
*H01S 3/00* (2006.01)
(Continued)

(52) U.S. Cl.
CPC .............. *H01S 3/11* (2013.01); *B23K 26/066* (2015.10); *B23K 26/0648* (2013.01);
(Continued)

(58) Field of Classification Search
CPC .. B23K 26/402; B23K 26/362; B23K 26/066; B23K 26/0821; B23K 26/082;
(Continued)

(56) References Cited

U.S. PATENT DOCUMENTS 6,040,552 A    3/2000  Jain et al.
7,752,752 B1   7/2010  Rusli et al.
(Continued)

FOREIGN PATENT DOCUMENTS

CN     101198218 A    6/2008
CN     102318451 A    1/2012
(Continued)

OTHER PUBLICATIONS

Phil T. Rumsby et al: "Laser Microprojection for Micromechanical Device Fabrication", Proceedings of SPIE; International Conference on Experimental Mechanics: Advances and Applications, S P I E—International Society for Optical Engineering, US; Singapore, vol. 2921, Mar. 20, 1997, pp. 684-692.
(Continued)

*Primary Examiner* — Robert J Grun
(74) *Attorney, Agent, or Firm* — Harness, Dickey & Pierce, P.L.C.

(57) ABSTRACT

Apparatus and methods for forming fine scale structures (4, 4', 4", 5, 6, 7, 8) in the surface of a dielectric substrate (3) to two or more depths are disclosed. In an example, the apparatus comprises a first solid state laser (12) arranged to provide a first pulsed laser beam (13), a first mask (16) having a pattern for defining a first set of structures (4, 6, 7, 8) at a first depth, a projection lens (17) for forming a reduced size image of said pattern on the surface (3) of the substrate and a beam scanner arranged to scan said first pulsed laser beam (13) in a two-dimensional raster scan relative to the first pattern to form a first set of structures (4,

(Continued)

6, 7, 5) at a first depth in the substrate, wherein the first or a further solid state laser is arranged to form a second set of structures (8) at a second depth in the substrate (3).

7 Claims, 6 Drawing Sheets

(51) Int. Cl.
B23K 26/06 (2014.01)
H01S 3/0941 (2006.01)
H01S 3/11 (2006.01)
B23K 26/073 (2006.01)
B23K 26/082 (2014.01)
B23K 26/066 (2014.01)
B23K 26/362 (2014.01)
B23K 26/402 (2014.01)

(52) U.S. Cl.
CPC ........ *B23K 26/0661* (2013.01); *B23K 26/073* (2013.01); *B23K 26/082* (2015.10); *B23K 26/0821* (2015.10); *B23K 26/362* (2013.01); *B23K 26/402* (2013.01); *H01S 3/0057* (2013.01); *H01S 3/0071* (2013.01); *H01S 3/0941* (2013.01); *H05K 3/0035* (2013.01); *H05K 3/0073* (2013.01); *H05K 2203/0557* (2013.01)

(58) Field of Classification Search
CPC .............. B23K 26/073; B23K 26/0661; B23K 26/0648; H05K 3/0026; H05K 3/0073; H05K 2203/0557; H01S 3/11; H01S 3/0941; H01S 3/0071; H01S 3/0057
See application file for complete search history.

(56) References Cited

U.S. PATENT DOCUMENTS

| 2002/0017511 | A1 | 2/2002 | Kling |
| 2004/0027630 | A1 | 2/2004 | Lizotte |
| 2005/0041398 | A1 | 2/2005 | Huemoeller et al. |
| 2008/0145567 | A1 | 6/2008 | Ohmae et al. |

FOREIGN PATENT DOCUMENTS

| JP | 2004174509 A | 6/2004 |
| JP | 2008180983 A | 8/2008 |
| JP | 2010120079 A | 6/2010 |
| TW | 201026417 A | 7/2010 |

OTHER PUBLICATIONS

Harvey E C et al: "Fabrication Techniques and their Application to Produce Novel Micromachined Structures and Devices using Excimer Laser Projection", Proceedings of SPIE, S P I E—International Society for Optical Engineering, US, vol. 3223, Sep. 29, 1997, pp. 26-33.
"Unveiling the next generation in substrate technology", Huemoeller et al, 2006 Pacific Micro-electronics Symposium.
EU165 (David Baron) at the 12th Electronic Circuit World Convention in Taiwan, Nov. 9-11, 2011.
TW086-2 (Yueh-Ling Lee & Barbara Wood) at the 12th Electronic Circuit World Convention in Taiwan, Nov. 9-11, 2011.
TW086-9 (Weiming Cheng & Mark Unrath) at the 12th Electronic Circuit World Convention in Taiwan, Nov. 9-11, 2011.
Notification of Reasons for Refusal for Japanese Patent Application No. 2015-540201, dated Nov. 15, 2016. Translation provided by J A Kemp.

METHOD AND APPARATUS FOR FORMING FINE SCALE STRUCTURES IN DIELECTRIC SUBSTRATE

CROSS REFERENCE TO RELATED APPLICATIONS

This application is a U.S. National Phase Application under 35 U.S.C. 371 of International Application No. PCT/GB2013/050995 filed on Apr. 19, 2013, which claims priority to British Patent Application No. 1219756.2 filed on Nov. 2, 2012. The contents of the above applications are incorporated herein by reference.

TECHNICAL FIELD

This invention relates to an apparatus and method for forming fine scale structures in the surface of a dielectric substrate. In a preferred arrangement, it is particularly relevant to the sequential formation of narrow groove, large area pad and ground-plane structures in the top surface of a layer of a polymer and drilling contact holes or vias to a greater depth for the purpose manufacturing multi-layer, high density interconnection devices based on buried conductors.

BACKGROUND ART

Lasers are widely used in the manufacture of advanced printed circuit boards (PCBs). A particularly well known example is the drilling of blind contact holes, so called micro-vias, in multi-layer PCBs. In this case ultra violet (UV) solid state lasers are often used to drill through a top copper layer and an underlying dielectric layer to allow contact to be made to a lower copper layer. In some cases, the cost effectiveness of this process is improved by using two different laser processes to remove the two different materials. A UV diode pumped solid state (DPSS) laser is usually used to drill the holes in the top copper layer to expose the lower dielectric layer and in a separate process a $CO_2$ laser is used to remove the dielectric material exposed below each hole.

Recently a new type of high density multi-layer circuit board manufacturing technology has been proposed. US2005/0041398A1 and publication "Unveiling the next generation in substrate technology", Huemoeller et al, 2006 Pacific Micro-electronics Symposium describe the concept of "laser-embedded circuit technology". In this new technology, lasers are used to directly ablate fine grooves, larger area pads and also contact holes in organic dielectric substrates. The grooves connect to the pads and contact holes so that, after laser structuring and subsequent metal plating, a first layer consisting of a complex pattern of fine conductors and pads embedded in the top surface of the dielectric layer is formed together with a second layer consisting of deeper contact holes connecting to a lower metal layer. More information on the progress of this new technology was presented in papers EU165 (David Baron) and TW086-2 (Yuel-Ling Lee & Barbara Wood) at the $12^{th}$ Electronic Circuit World Convention in Taiwan, Nov. $9^{th}$-$11^{th}$ 2011.

Up to now pulsed UV lasers have been used in such methods to form the grooves, pads and contact holes in a single process using either direct write or mask imaging methods.

The direct write approach generally uses a beam scanner to move a focussed beam from a laser over the substrate surface to scribe the grooves and also create the pad and contact hole structures. This direct write approach uses a highly focusable beam from a UV diode pumped solid state (DPSS) lasers with high beam quality and hence is very well suited to the fine groove scribing process. It is also able to deal well with the different layer depth requirements associated with pad and contact hole structures. By this method, grooves, pads and contact holes of different depth can be readily formed. However, because of the limited laser power available from highly focusable UV DPSS lasers, this direct write process is slow when it comes to removing the more substantial volume of material associated with the larger area pads and ground planes. This direct write method also has difficulty maintaining constant depth at the intersections between grooves and pads. A description of direct write laser equipment suitable for making PCBs based on embedded conductors was presented in paper TW086-9 (Weiming Cheng & Mark Unrath) at the $12^{th}$ Electronic Circuit World Convention in Taiwan, Nov. $9^{th}$-$11^{th}$ 2011.

The mask imaging approach generally uses a UV excimer laser to illuminate a mask containing the full detail of one layer or level of the circuit design. An image of the mask is demagnified onto the substrate such that the full area of the circuit on that layer is reproduced on the substrate with a laser pulse energy level sufficient to ablate the dielectric material. In some cases, where the circuit to be formed is large, relative synchronized motion of the mask and substrate is used to transfer the full pattern. Excimer laser mask projection and associated strategies for covering large substrate areas have been known for many years. Proc SPIE 1997, vol. 3223, p 26 (Harvey & Rumsby) gives a description of this approach.

Since the whole area of the mask is illuminated during the image transfer process, this approach is insensitive to the total area of the individual structures to be created and hence is well suited to creating both the fine grooves, the larger area pads and ground planes. It is also excellent at maintaining depth constancy at the intersections between grooves and pads. However, due to ablation rate dependence on structure size, control of depth to high precision over all features is often difficult. Except in the case where the circuitry is extremely dense, this mask imaging approach is also significantly more costly than the direct write approach since the purchase and operating costs of excimer lasers are both very high. Mask imaging is also very inflexible in that a new mask needs to be used for each layer of the circuit.

The latter limitation is overcome in the arrangement described in publication US 2008/0145567 A1. In this case, an excimer laser scanning mask projection system is used to form a layer consisting of grooves and pads to the same depth in the insulating layer and, in a separate process, using a second laser which is delivered by a separate beam delivery system, the deeper contact holes penetrating to an underlying metal layer are formed. This two-step process is a way of dealing with the varying depth structure requirements. However, it still suffers from the high cost associated with the use of excimer lasers.

Hence, it can be seen that the existing process methods for making advanced circuits based on this "laser-embedded circuit technology" have serious disadvantages. There remains a need to be able to use laser processes that are optimized for creating the different size and depth structures required in a very flexible way, to improve the process rate and reduce the cost. The present invention aims to provide apparatus and a multistage stage process that retain the advantages of mask imaging but avoids the use of costly excimer lasers to address these needs.

According to a first aspect of the invention, there is provided apparatus for forming fine scale structures in the surface of a dielectric substrate to two or more depths, the apparatus comprising:

a first solid state laser arranged to provide a first pulsed laser beam; a first mask having a pattern for defining a first set of structures at a first depth, a projection lens for forming a reduced size image of said pattern on the surface of the substrate and a beam scanner arranged to scan said first pulsed laser beam in a two-dimensional raster scan relative to the first mask to form a first set of structures at a first depth in the substrate, and the first or a further solid state laser arranged to form a second set of structures at a second depth in the substrate.

According to a further aspect of the invention, there is provided a method of forming fine scale structures in the surface of a dielectric substrate to two or more depths, the method comprising a two-stage process: a first process which defines a first set of structures at a first depth and a second process which defines a second set of structures at a second depth, the first process comprising: using a first solid state laser to provide a first pulsed laser beam; providing a first mask having a pattern for defining a first set of structures at a first depth, providing a projection lens for forming a reduced size image of said pattern on the surface of the substrate and scanning said first pulsed laser beam in a two-dimensional raster scan relative to said mask to form a first set of structures at a first depth in the substrate, the second process comprising use of the first or a further solid state laser to form a second set of structures at a second depth in the substrate, in which the first and second processes can be carried out in either order.

The invention thus involves a method which uses a solid state laser (SSL), a first process which involves 2D scanning of the laser beam (e.g. in the form of a laser spot) over a mask to form a first set of structures in the surface of a dielectric substrate and a second process (which can be carried out in a variety of ways) to form a second set of structures in the dielectric substrate.

The choice of laser enables the scanning to be carried out at high speed so the structures can be formed in a short time period whilst avoiding the need for high capital cost and/or high operating costs. The process also allows each of the process steps for forming the different types of structures to be separately optimised.

Key preferred features of the invention are:—
1) A method for forming sets of fine scale structures which, after a subsequent copper plating process, form an "embedded conductor" based electronic circuit layer being part of a multi-layer, high density, electrical interconnection device,
2) Sets of structures being formed in the surface of a dielectric material to two or more different depths, each depth being achieved using a separate laser ablation process,
3) A first process that creates a first set of structures to a first depth in the following way
    a. a first mask defines the first set of structures;
    b. a projection lens forms a reduced size image of the first mask on the substrate surface;
    c. a beam scanner unit moves the beam from a first Q-switched CW diode pumped solid state (DPSS) laser over the mask in a 2D raster pattern;
    d. the energy density in the laser beam at the substrate on each laser pulse is sufficient to ablate the material of the substrate but not to damage the mask;
    e. the laser beam spot size and shape at the mask coupled to the trajectory of the 2D motion of the beam over the mask surface are such that the first set of structures is defined to a uniform first depth over the full area of the device on the substrate,
4) a second process that creates a second set of structures to a second depth over all or part of the device, the second set of structures being superimposed on some or all of the first set of structures so that the second depth is greater than the first depth. The second process uses one of the following methods:
    a. It repeats the first process using the first laser and the first mask to define the second set of structures but using different laser parameters to the first process. This could be the case when the substrate is layered with different materials or has a protective or sacrificial layer applied to the top side as shown in FIG. 3. In this case, the first process laser patterns the top layer of material or the protective/sacrificial layer and the second process laser patterns the material layer below;
    b. It repeats the first process using the first laser but with a second mask to define the second set of structures;
    c. Using the first mask with the beam from the first laser moved by the scanner to selected areas of the first mask and the first laser fired for a number of pulses such that those selected areas are subject to sufficient additional pulses to create a second set of structures having a second depth;
    d. Using the first mask with an aperture in the first laser beam, the first laser beam being moved by the scanner to selected transparent features on the first mask, the aperture being imaged onto the mask such that the image on the mask is smaller than the transparent feature and the first laser fired such that those selected areas are subject to additional laser pulses and hence a second set of structures are formed to a second depth within and smaller than the first set of structures;
    e. Using the first mask with a second laser which is different to the first laser, the beam from the second laser being moved by the scanner to selected transparent features on the first mask and controlled such that the beam on the mask is smaller than the transparent feature and the second laser fired such that those selected areas are subject to additional laser pulses and hence a second set of structures is formed to a second depth within and smaller than the first set of structures,
5) A further process, if required, to create a further set of structures to a further depth over all or part of the device, the further set of structures being superimposed on some or all of the first or second set of structures so that the further depth is greater than the first or second depth. The further process uses one of the methods described above in sections 4.a-4.d,
6) In some cases, the first process may follow the second process. For example, second processes 4.c, d and e could all take place before the first process and the result in terms of the formation of two sets of structures to two depths in the substrate is the same.

The mask used for the first and second processes may comprise a 2D array of pixels whose transparency to the laser beam can be changed electronically so that the full mask pattern can be changed dynamically.

Other preferred and optional features of the invention will be apparent from the following description and from the subsidiary claims of the specification.

BRIEF DESCRIPTION OF DRAWINGS

The invention will now be further described, merely by way of example, with reference to the accompanying drawings, in which.

DESCRIPTION OF PREFERRED EMBODIMENTS

Figure 1:
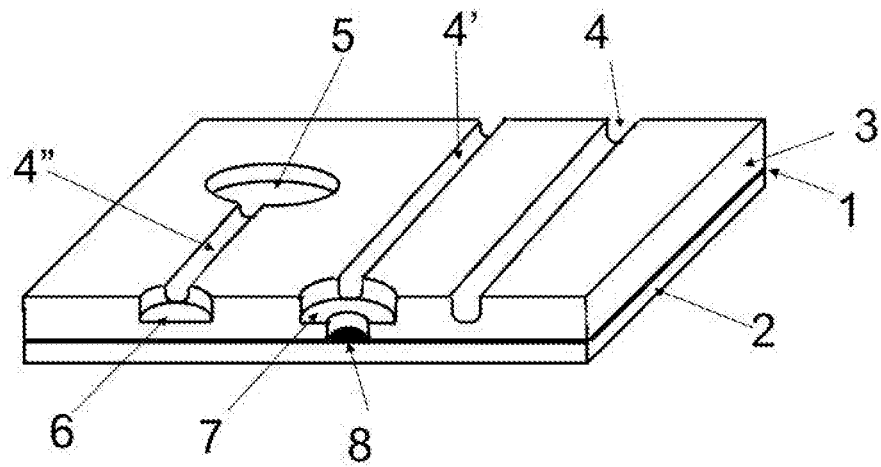
FIG. 1 is a perspective view of a typical HDI printed circuit board showing the type of structures required to be formed therein.

FIG. 1: This shows a section of a high density interconnect (HDI) printed circuit board (PCB) or integrated circuit (IC) substrate and indicates the type of "embedded" structures that are required to be formed. A copper layer 1, patterned to form an electrical circuit, is supported on a dielectric core layer 2. The copper layer 1 is over coated with an upper dielectric layer 3 into which various structures have been formed by laser ablation. Grooves 4, 4' and 4", large pad 5 and small pads 6 and 7 all have the same depth which is less than the full thickness of the upper dielectric layer 3. For IC substrates, groove widths and pad diameters required are typically in the range 5 to 15 microns and 100 to 300 µm, respectively, with depths in the range 5 to 10 microns. For HDI PCBs, grooves may be wider and deeper. Contact hole (or via) 8 inside pad 7 is formed by laser ablation to a greater depth such that all the upper dielectric layer material is removed to expose an area of the copper circuit below. Contact hole depths may be typically twice the depth of pads and grooves.

Figure 2:
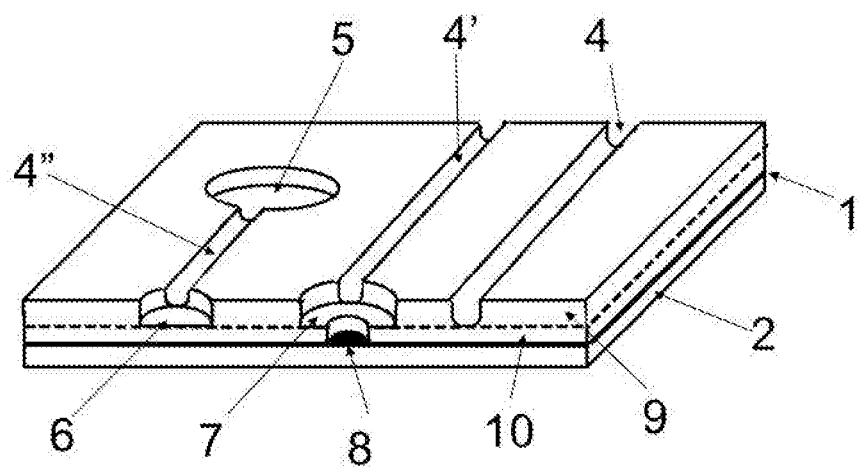
FIG. 2 is a perspective view similar to FIG. 1 in which the printed circuit board comprises an upper and lower dielectric layer.

FIG. 2: This shows a similar section of an HDI PCB or IC substrate as FIG. 1 but in this case the upper dielectric layer on top of the copper layer consists of two layers of different material, upper dielectric layer 9 and lower dielectric layer 10. Grooves 4, 4' and 4", large pad 5 and small pads 6 and 7 all penetrate the upper layer 9 completely but do not significantly penetrate the lower layer 10. Contact hole 8 penetrates the lower dielectric layer 10 completely to expose an area of the copper circuit below.

Figure 3:
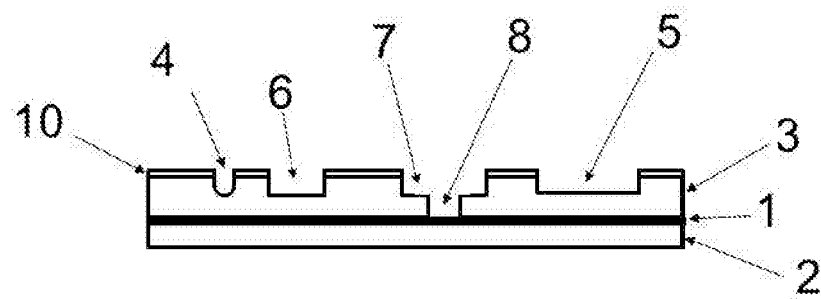
FIG. 3 is a sectional view of another typical printed circuit board having a thin protective or sacrificial layer formed thereon.

FIG. 3: This shows a section through an HDI PCB where a thin protective or sacrificial layer of material 11 has been applied to the top side of the dielectric layer 3 before laser patterning of the structures. Such protective layers are generally at most only a few microns thick and their main purpose is to protect the top surface of the dielectric layer 3 from damage during the laser ablation process. During laser ablation of the structures, the beam penetrates the material of the protective layer and removes material to the required depth in the dielectric layer 3 below. After completion of the laser ablation process and before subsequent processes, the protective layer is usually removed to expose the dielectric material.

Figure 4:
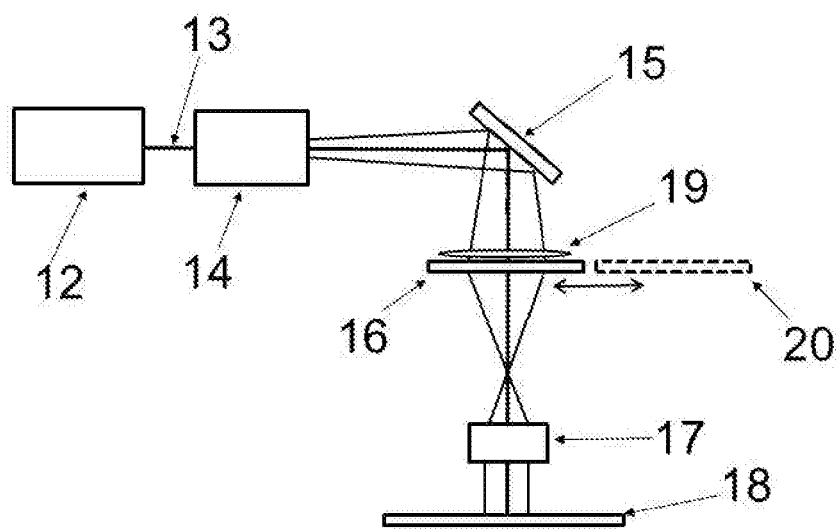
FIG. 4 is a schematic diagram of known apparatus for forming embedded structures in a dielectric layer.

FIG. 4 shows known apparatus as commonly used to create embedded structures in dielectric layers. Excimer laser 12 emits a pulsed UV beam 13 which is shaped by homogenizer unit 14, deviated by mirror 15 and illuminates the whole of mask 16 uniformly. Projection lens 17 demagnifies the image of the mask onto the surface of the dielectric coated substrate 18 such that the energy density of the beam at the substrate 18 is sufficient to ablate the dielectric material and form structures in the layer corresponding to the mask pattern.

Lens 19 is a field lens that serves to control the beam entering the lens 17 such that it performs in an optimum way. On each laser pulse the pattern on the mask is machined into the surface of the dielectric to a well-defined depth. Typically, the depth machined by each laser pulse is a fraction of a micron so many laser pulses are required to create grooves and pads with depth of many microns. If features of different depth are required to be machined into the substrate surface then the mask that defines the first level is exchanged for another mask 20 that defines the deeper level after which the laser ablation process is repeated.

To illuminate the full area of each mask and the corresponding area on the substrate with one laser pulse requires pulses with high energy from the laser. For example, if the size of the device to be made is 10×10 mm (1 cm$^2$) and since the pulse energy density required for efficient ablation is about 0.5 J/cm$^2$ then the total energy per pulse required at the substrate is 0.51 Because of losses in the optical system, significantly more energy per pulse is required from the laser. UV excimer lasers are very appropriate for this application since, typically, they operate with high pulse energies at low repetition rate. Excimer lasers emitting output pulse energies up to 1 J at repetition rates up to 300 Hz are readily available. Various optical strategies have been devised to allow the manufacture of larger devices or allow the use of excimer lasers with lower pulse energy.

Figure 5:
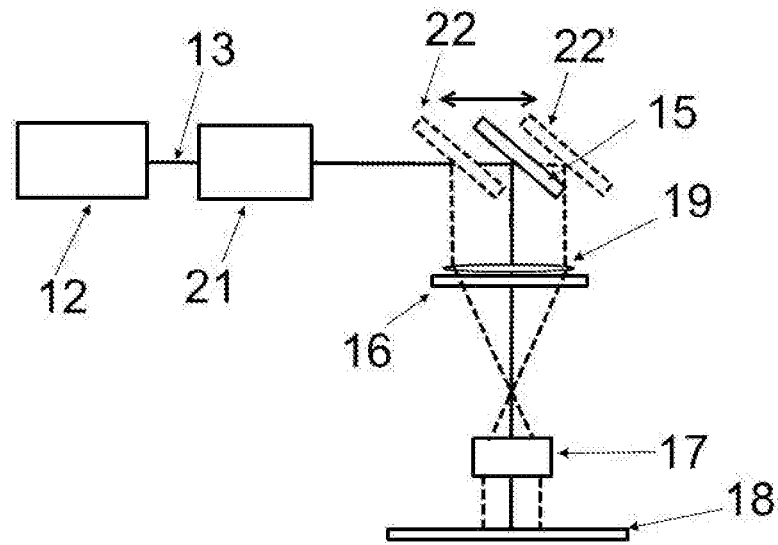
FIG. 5 is a schematic diagram of another known apparatus for forming embedded structures in a dielectric layer.

FIG. 5 shows prior art illustrating such a case where beam shaping optics 21 are arranged to create a line beam at the surface of the mask 16. This line beam is sufficiently long to cover the full width of the mask. The line beam is scanned over the surface of the mask in a direction perpendicular to the line by the 1D motion of mirror 15. By moving mirror 15 in a line from position 22 to 22' the whole area of the mask is sequentially illuminated and correspondingly the whole area to be machined on the substrate is sequentially processed. Mask, projection lens and substrate are all maintained stationary while mirror 15 is moved.

Figure 6:
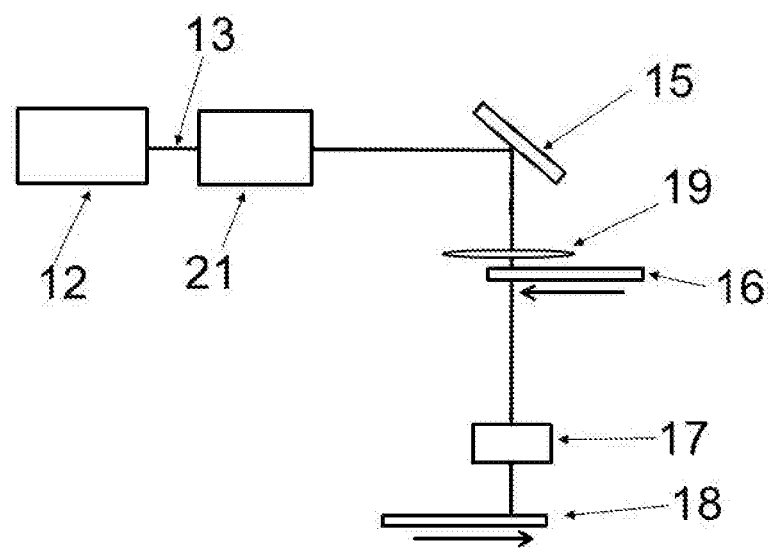
FIG. 6 is a schematic diagram of further known apparatus for forming embedded structures in a dielectric layer.

The mirror is moved at a speed that allows the correct number of laser pulses to impact each area of the substrate to create structures of the required depth. For example for an excimer laser operating at 300 Hz and a line beam at the substrate with a width of 1 mm and where each laser pulse removes material to a depth of 0.5 microns then 20 laser pulses per area are required to create structures with depth of 10 microns. Such an arrangement requires the line beam to move across the substrate at a speed of 15 mm/sec. The speed of the beam at the mask is greater than that at the substrate by a factor equal to the demagnification factor of the lens FIG. 6 shows another known arrangement and illustrates an alternative way to deal with the limited laser pulse energy issue. This involves moving both the mask and substrate in an accurately linked way with respect to a beam that is stationary. Beam shaping optics 21 form a line beam with a length that spans the full width of the mask. In this case, mirror 15 remains stationary and the mask 16 is moved linearly as shown. In order to generate an accurate image of the mask on the substrate, it is necessary for the substrate 18 to move in the opposite direction to the mask as shown at a speed that is related to that of the mask by the demagnification factor of the imaging lens 17. Such 1D mask and substrate linked motion systems are well known in excimer laser wafer exposure tools for semiconductor manufacturing.

Excimer lasers have also been used with 2D mask and substrate scanning schemes in situations where the area of the device to be processed is very large and there is insufficient energy in each laser pulse to create a line beam across the full width of the device. Proc SPIE., 1996 (2921), p684 describes such a system. Such systems are very complex requiring highly accurate mask and work-piece stage control and, in addition, obtaining uniform ablation depth in the regions on the substrate where the scan bands overlap is very difficult to control.

Figure 7:
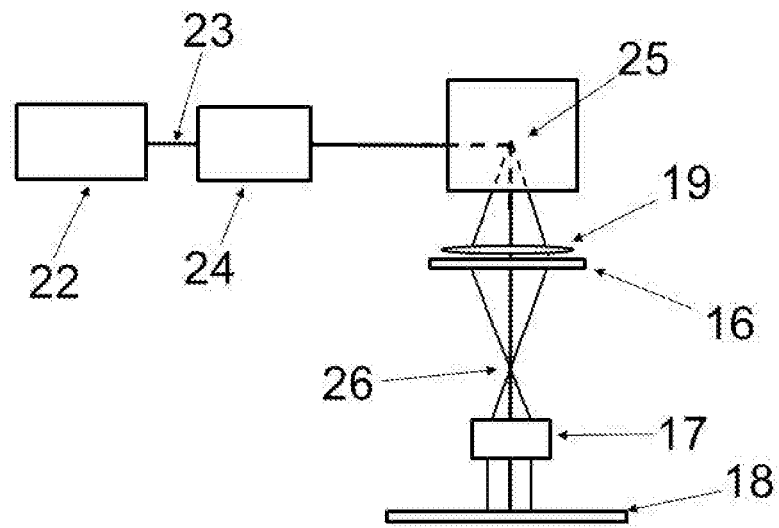
FIG. 7 is a schematic diagram of apparatus for forming a first layer of an embedded structure in a dielectric layer according to an embodiment of the present invention.

FIG. 7 shows an embodiment according to a preferred form of the current invention. This is similar to the prior art shown in FIGS. 4, 5 and 6 in that a mask projection optical system is used is used to define the structure of the circuit layer in the substrate but with a major difference that, instead of a UV excimer laser, a Q-switched CW diode pumped solid state (DPSS) laser is used. Such a laser operates in a very different way to an excimer laser emitting pulses with low energy (e.g. 0.1 mJ to few 10 s of mJ) but at a high (multiple kHz to 100 kHz) repetition rate. Q-switched DPSS lasers of many types are now readily available. For the method described herein a multimode DPSS laser operating in the UV region is preferred as UV is more suitable for ablation of a wider range of dielectric materials and optical resolution of imaging lenses is superior compared to longer wavelengths. In addition, higher powers are generated by multimode (MM) lasers compared to low and single mode lasers. Other pulsed DPSS lasers with longer wavelength and with lower mode beam output may also be used in the method described.

For example, UV MM CW diode pumped solid state lasers can be used that operate at a wavelength of 355 nm giving powers of 20, 40 or 80 W at a repetition rate of around 10 kHz so giving output pulse energies of 2, 4 and 8 mJ, respectively. Another example is an MM UV DPSS laser which gives 40 W at a repetition rate of 6 kHz and hence giving 6.7 mJ per pulse. Further examples are UV lower mode CW diode pumped solid state lasers that can be operated at a wavelength of 355 nm giving powers of 20 or 28 W at a repetition rate of around 100 kHz and hence giving output pulse energies of 0.2 and 0.28 mJ, respectively.

As shown in FIG. 7, an MM UV DPSS laser 22 emits output beam 23 which is shaped by optics 24 to form a circular or other shaped spot of appropriate size at the mask 16 such that, after imaging onto the substrate surface 18 by lens 17, the energy density is sufficient to ablate the material on the surface of the substrate 18. 2D scanner unit 25 moves the spot over the mask 16 in a 2D raster pattern such that the full area of the mask 16 is covered and, correspondingly, the full area to be processed at the substrate 18 is also covered imprinting the image of the pattern on the mask 16 into the substrate surface. Preferably, lens 17 has telecentric performance on the image side. This means that a parallel beam is formed by the lens so that variations in the distance to the substrate do not change the size of the image. This avoids the need to position the substrate with great accuracy along the optical axis and allows any non-flatness of the substrate to be accommodated.

In this arrangement, the lens 19 serves the function of imaging a plane between the mirrors of the scanner 25 into the entrance pupil 26 of the lens so that the conditions for telecentric performance are met. It is important that the lens 17 has sufficient optical resolution to accurately form well defined structures down to 5 μm or less in the surface of the dielectric layer. The resolution is determined by the wavelength and numerical aperture and for a laser wavelength of 355 nm, this translates to a numerical aperture of about 0.15 or greater. The other requirement for the lens is that it demagnifies the pattern on the mask onto the substrate such that the energy density of laser pulses at the substrate is high enough to ablate the material but the energy density at the mask is low enough such that the mask material which is probably a patterned chrome layer on a quartz substrate is not damaged. A lens magnification factor of 3× or more is found to be appropriate in most cases. An energy density of 0.5 J/cm$^2$ at the substrate is generally sufficient to ablate most polymer dielectric materials and hence with a lens demagnification of 3× and, allowing for reasonable losses in the lens, the corresponding energy density at the mask is less than 0.07 J/cm$^2$, a level that is well below the damage level of a chrome on quartz mask.

Figure 8:
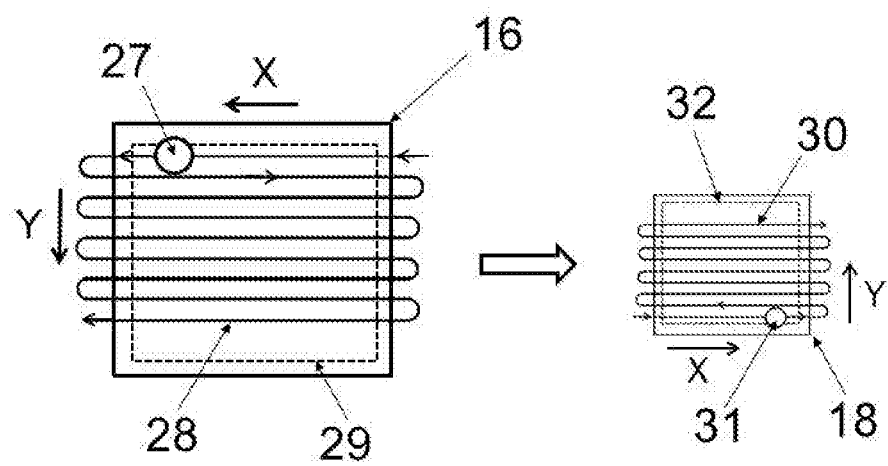
FIG. 8 is a plan view of a mask used in the apparatus of FIG. 7 and scanning trajectory used therewith.

FIG. 8 shows a plan view of the mask 16 used in the arrangement of FIG. 7. Laser beam spot 27, which in this case is round, is moved in the X and Y directions in a raster shaped trajectory 28 so that the full patterned area of the mask 29 is covered. FIG. 8 also shows the corresponding raster path 30 followed by reduced size laser spot 31 over a reduced size laser machined area 32 on the substrate. For cases where the groove, pad and other structures on the mask are required to be machined into the surface of the substrate to a constant depth, it is important that each area of the mask receives the same effective dose of laser radiation. Since the beam at the mask is very likely to have a non-uniform distribution of energy density and the depth of substrate material removed on each laser pulse generally varies non-linearly with energy density, the exact trajectory of the beam over the mask surface in order to cause ablation to a uniform depth will depend on the beam shape and beam profile and will, generally, be determined experimentally.

A simple example is a situation where a complex pattern of grooves and pads is to be laser machined into the surface of the dielectric material to a uniform depth of 5 μm to form a first layer of an electronic circuit with an area 32 of 14×14 mm. The laser is a multimode 40 W UV (355 nm) CW pumped DPSS laser operating at a repetition rate of 10 kHz and emitting pulses each having an energy of 4 mJ of which 3 mJ reaches the substrate after losses in optics. A typical dielectric material on the substrate might have ablation characteristics at 355 nm such that, at an energy density of 0.5 J/cm$^2$, each laser pulse removes material to a depth of 0.33 nm. To achieve this energy density in a round spot the diameter required is 0.87 mm at the substrate and 2.6 mm at the mask (assuming a 3× de-magnification factor).

At an ablation rate of 0.33 nm per laser pulse, each area of the substrate needs to be exposed to a total of 15 laser pulses to create structures with a total depth of 5 μm. This can be readily achieved by appropriate overlapping of the individual laser spots on the surface of the substrate and correspondingly on the mask. For example, considering the scanning of the mask as shown in FIG. 7, at a laser repetition rate of 10 kHz, a beam scanning velocity in the X direction of 5.2 m/sec causes 5 laser pulses to be applied to each area along the X direction. If the Y pitch between parallel scan lines on the mask is arranged to be ⅓ of the spot diameter, then 3 shots per area are applied in the Y direction leading to a total of 15 shots per area. It will be appreciated that several other combinations of X and Y shot overlaps are possible to achieve 15 shots per area.

Such a simple calculation of beam overlap in each axis is unlikely to lead to an ideal result in terms of uniformity of depth of the structure over the full device area, especially for a round beam with a non-uniform energy density distribution, and in general it will be necessary to experimentally determine the overlap in each axis that leads to uniform ablation depth. However, when the laser beam at the mask is optically homogenized to provide uniform energy density and to form a tessellating shape (such as a square, rectangle or hexagon), the trajectory of the beam on the mask surface can be predicted more readily.

For complete uniform coverage of the active mask area 29, it is necessary to scan at least one laser beam spot diameter beyond all four edges of the mask. With an active mask area of 42×42 mm, using the laser beam scan speeds discussed above, a total mask and substrate scan time of just over 0.5 sec is achievable.

If the substrate has a protective layer on top as shown in FIG. 3, it may be appropriate to fully scan the mask twice using two different fluence values. The first scan uses a fluence optimized for ablation of the thin protective layer and the second scan uses a fluence optimized for deeper ablation into the underlying dielectric layer.

If the pattern information on the mask is not uniformly distributed but is localized to specific areas of the mask, then only these areas need be scanned (so reducing the mask scan time).

The scanning strategies discussed above create structures of uniform depth in the dielectric material so the remaining requirement is to create structures comprising two or more layers as shown in FIG. 1, 2 or 3. There are several ways of doing this with the type of mask scanning approach described above and some of these will now be described.

Figure 9:
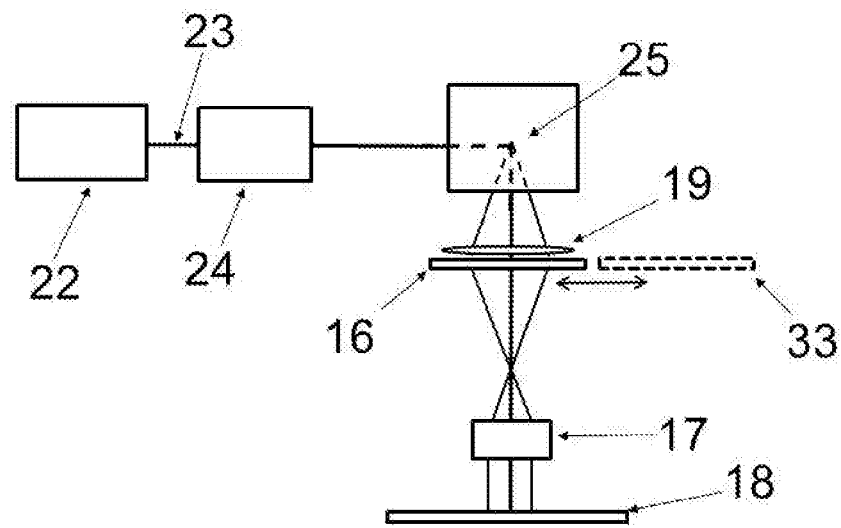
FIGS. 9 to 12 are schematic diagrams of apparatus according to embodiments of the present invention illustrating alternative arrangements for forming a second layer of the structure in the dielectric substrate.

FIG. 9 shows the simplest way of creating a two layer structure. A first mask 16 is scanned over its full area to create the upper layer groove and pad structure following which the first mask 16 is replaced with a second mask 33 which has the pattern associated with the lower layer via structure. Accurate registration of the masks is, of course, required to ensure that the two laser machined patterns are superimposed on the substrate surface accurately.

Such a multiple, sequential scanned mask approach is preferred when the lower layer pattern has a high density of features such that scanning all or a large part of the lower layer mask is efficient. If, on the other hand, only a few deeper features such as vias located within pad areas defined by the upper layer mask are required then alternative methods are possible.

Figure 10:
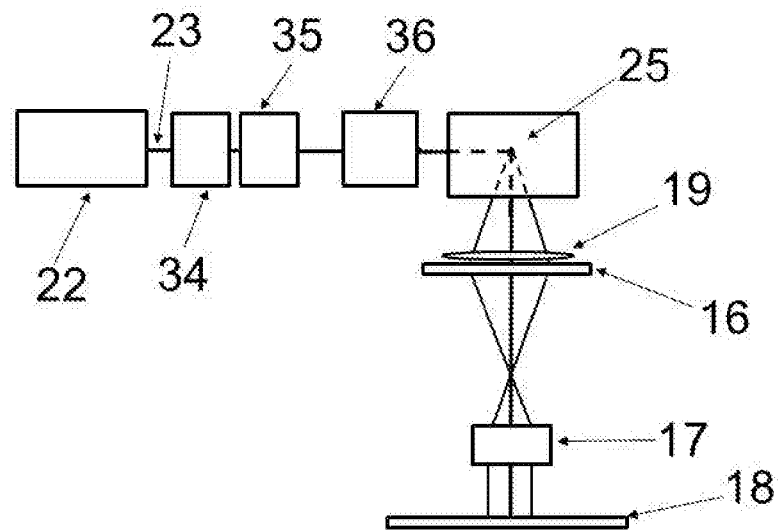

FIG. 10 shows one method for using a single laser in an imaging arrangement as shown in FIG. 7 so that a few, deeper features can be incorporated into the device structure. MM UV DPSS laser 22 emits output beam 23 which is shaped by optics 34 to form a spot of appropriate size at aperture unit 35. Optical elements 36 image the aperture 35 onto the mask 16 and lens 17 re-images the aperture onto the surface of the substrate 18. In this case, the processing of layers to varying depths is carried out in at least two stages. In the first stage, the aperture is removed or set to one of large size so the full beam from the laser passes through or it may be set to a suitable tessellating shape and the full mask area is scanned with the correct beam trajectory such that the upper layer mask pattern, including all grooves, pads and other structures, is defined to the correct depth in the substrate. At a second stage, an aperture of appropriate size is moved into the beam to define the required vias. The scanner 25 is then operated in "point and shoot" mode whereby the beam is moved to areas on the mask 16 defining pad areas and the beam is held stationary while the required number of laser shots to drill the via to expose the copper layer below or to the required depth is fired. After this, the beam is moved to another pad area and the process repeated. This process continues until all vias in the lower layer have been drilled. Vias of different size can be drilled by inserting different size apertures in subsequent stages.

The order in which the various patterning stages can carried out can also be varied. It is possible to drill all the vias in aperture imaging, point and shoot, mode at a first stage followed by definition of the grooves and pads at a subsequent mask scanning stage. In this case, via drilling does not need to penetrate the full depth from the substrate surface to the buried copper layer since additional laser shots will be applied during the mask scanning process.

Figure 11:
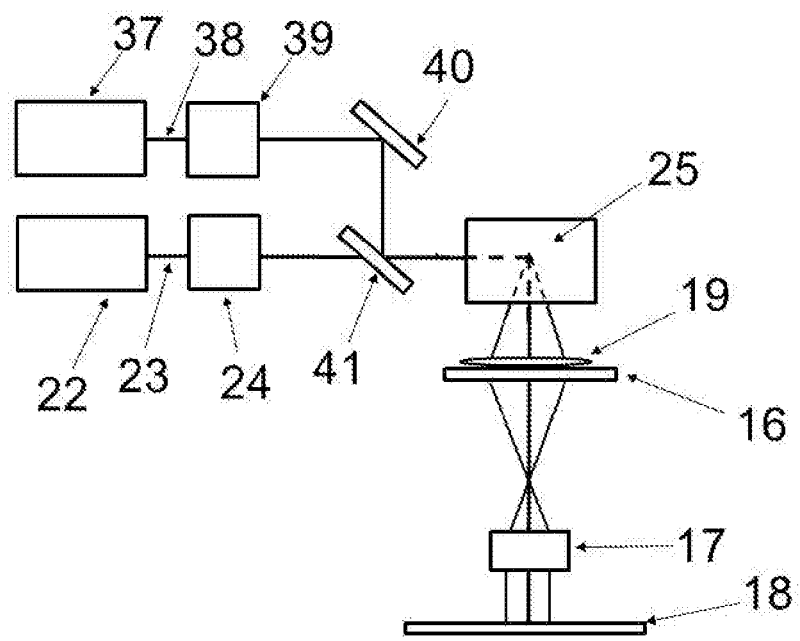

FIG. 11 shows an alternative method for drilling deeper features using two lasers. A first laser 22, which is typically an MM UV DPSS laser, emits output beam 23 which is shaped by optics 24 to form a circular or other shaped spot of appropriate size at the mask 16. This first laser 22 is used to scan the mask to form the grooves and pads as described above. A second laser 37 having different characteristics to laser 22 in terms of one or more of the following: wavelength, pulse length, mode structure or repetition rate emits a beam which passes through optical components 39 and is directed via mirrors 40 and 41 and the scanner 25 to the surface of the mask 16. Mirror 41 may be of movable type and have two positions either in or out of the path of laser beam 23 to allow, respectively, either the second laser beam 38 to be reflected from mirror 41 to pass to the scanner or the first laser beam 23 to pass directly to the scanner. Preferably, mirror 41 is of a polarization selective type so that the polarizations of the two laser beams can be set such that laser beam 23 from laser 22 has p-polarization at mirror 41 and hence passes through the mirror to the scanner or laser beam 38 from laser 37 has s-polarization at mirror 41 and is thus reflected to the scanner.

Examples of lasers suitable for this second laser process are generally the same as described above for the first laser process but with the addition that, where the second laser is required to make small diameter vias, lasers with low mode output giving lower powers may be satisfactory.

Optical components 39 shape or focus laser beam 38 so that it's properties at the mask are such that the correct laser parameters for ablation of material at the substrate 18 are achieved. If required, apertures of suitable size together with optics to image the aperture onto the mask surface can be placed in either or both laser beams 23 and 38 to better define the size and shape of the beam at the mask.

The advantage of using two lasers is that the properties of each laser can be optimized to give the most efficient laser ablation. For example, for the case where grooves and large pads are required to be formed to a first depth in the dielectric, and then small diameter vias penetrating to the copper layer are required, it is preferable that the first laser is of a high power multimode type to allow the mask to be scanned rapidly while the second laser is of low or single mode type with a higher repetition rate so that smaller laser spots at the substrate can be more readily formed and small diameter vias formed rapidly.

Figure 12:
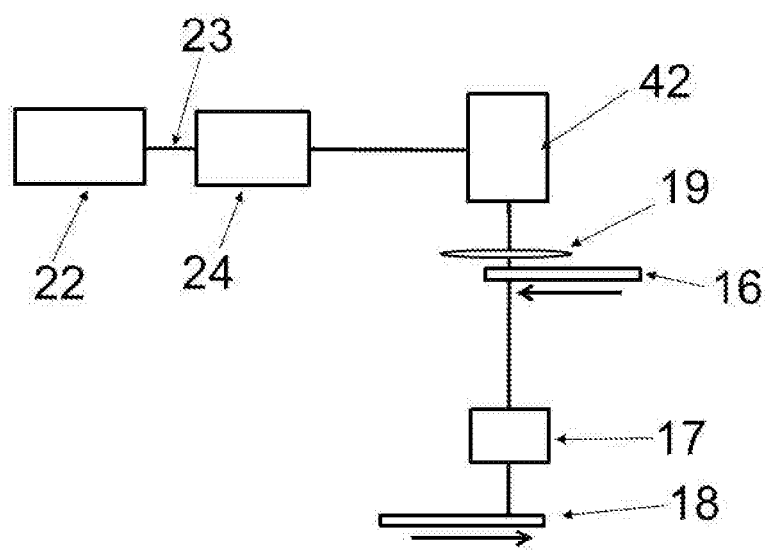

FIG. 12 shows an arrangement where the features of the process described above can be best used to form structures in the surface of substrates that are long and narrow such as might be useful for making flexible electrical connectors. The arrangement shown in FIG. 12 is similar to that shown in FIG. 6 in that both mask and substrate are moved in opposite directions to form structures over areas that are long and narrow but in the arrangement shown in FIG. 6, the high pulse energy laser beam is formed into a line beam covering the full width of the pattern on the mask whereas, in the arrangement shown in FIG. 12, the low pulse energy laser beam is formed into a spot at the mask which is scanned at high speed across the width of the mask as the mask and substrate are moved relative to the scanner in a direction perpendicular to the scanning direction (so the combined movement results in a 2D scanning of the laser spot relative to the mask). For this type of scanning arrangement, the scanner 42 can be of a polygon scanner type.

One major advantage of all the arrangements described above is that due to the use of a solid state laser the costs associated with processing a given area of substrate are significantly lower than if an excimer laser was used. In addition, due to the significantly simpler and more efficient beam delivery optics used with solid state lasers compared to excimer lasers, a lower power solid state laser can be used to process a given substrate in a given time. An example, is a device with an area of 2 cm² which is required to be machined by laser to a depth of 5 microns in a time of 0.5 sec. With an ablation rate of 0.33 microns per laser pulse at an energy density of 0.5 J/cm², a total of 15 J of energy needs to be delivered to the substrate area to achieve the desired depth. Assuming beam delivery transmissions of 80% and 50% for solid state and excimer lasers, respectively, to achieve the required 0.5 sec process time requires a solid state laser emitting less than 40 W whereas an excimer laser with an output power of 60 W would be required.

Taking capital depreciation (e.g. over 5 years) into account, the typical cost of a UV excimer laser is about USD100 per MJ of output energy. About 60% of this cost is associated with the costs of gases and consumable parts. In contrast, a UV solid state laser typically costs about USD50 per MJ (with only about 10% of this cost being associated with consumable parts). Thus, if both laser capital and operating costs are included, and the different laser powers required are taken into account, the cost of operation of a 40 W solid state laser required to machine the substrate is approximately one third of the operating costs of the 60 W equivalent excimer laser.

The invention claimed is:

1. A method of forming fine scale structures in the surface of a dielectric substrate to two or more depths, the method comprising a two-stage process:
a first process which defines a first set of structures at a first depth and a second process which defines a second set of structures at a second depth, the first process comprising: using a first solid state laser to provide a first pulsed laser beam;
providing a first mask having a pattern for defining a first set of structures at a first depth, providing a projection lens for forming a reduced size image of said pattern on the surface of the substrate and scanning said first pulsed laser beam in a two-dimensional raster scan relative to said mask to form a first set of structures at a first depth in the substrate, the second process comprising use of the first or a further solid state laser to form a second set of structures at a second depth in the substrate, in which the first and second processes can be carried out in either order.

2. The method as claimed in claim 1 in which the second process comprises use of the first solid state laser using different laser parameters to those used in the first process.

3. The method as claimed in claim 1 in which the second process comprises use of the first solid state laser and a second mask for defining a second set of features at a second depth in the substrate, the second mask being inter-changed with the first mask.

4. The method as claimed in claim 1 in which the second process comprises using the first solid state laser to fire a number of laser pulses at the substrate whilst the substrate is stationary to form a second set of features at a second depth in the substrate.

5. The method as claimed in claim 1 in which the second process comprises use of an aperture in the first laser beam so the aperture is imaged onto the first mask and the first laser used to form a second set of features at a second depth in the substrate.

6. The method as claimed in claim 1 in which the second process comprises use of a second solid state laser which is different from the first solid state laser, the second laser being scanned over the first mask so as to form a second set of features at a second depth in the substrate.

7. The method as claimed in claim 1 in which the first, second or a further solid state laser is used to form a third set of structures at a third depth in the substrate.

* * * * *